United States Patent
Zhang et al.

(10) Patent No.: US 7,768,290 B2
(45) Date of Patent: Aug. 3, 2010

(54) CIRCUIT AND APPARATUS FOR DETECTING ELECTRIC CURRENT

(75) Inventors: Zongmin Zhang, Shenzhen (CN); Xingxue Zhou, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 12/501,782

(22) Filed: Jul. 13, 2009

(65) Prior Publication Data
US 2009/0267589 A1    Oct. 29, 2009

Related U.S. Application Data

(63) Continuation of application No. PCT/CN2007/070979, filed on Oct. 29, 2007.

(30) Foreign Application Priority Data

Mar. 22, 2007    (CN) .................. 2007 1 0073627

(51) Int. Cl.
*G01R 31/26* (2006.01)
(52) U.S. Cl. ...................... 324/769; 324/765
(58) Field of Classification Search .............. 324/769
See application file for complete search history.

(56) References Cited

U.S. PATENT DOCUMENTS

| | | | |
|---|---|---|---|
| 3,993,951 A | 11/1976 | Kuanishu | |
| 4,945,445 A * | 7/1990 | Schmerda et al. | 361/101 |
| 5,592,394 A | 1/1997 | Wiscombe | |
| 5,886,567 A | 3/1999 | Park et al. | |
| 6,965,838 B1 * | 11/2005 | Bandholz | 702/65 |
| 7,248,979 B2 * | 7/2007 | Bandholz | 702/65 |
| 7,423,446 B2 * | 9/2008 | Agarwal et al. | 324/769 |
| 7,439,755 B2 * | 10/2008 | Jenkins et al. | 324/769 |
| 7,498,864 B2 * | 3/2009 | Grover | 327/525 |

(Continued)

FOREIGN PATENT DOCUMENTS

CN    87102521 A    10/1988

(Continued)

OTHER PUBLICATIONS

International Search Report from P.R. China in International Application No. PCT/CN2007/070979 mailed Jan. 24, 2008.

(Continued)

*Primary Examiner*—Roberto Velez
(74) *Attorney, Agent, or Firm*—Finnegan, Henderson, Farabow, Garrett, Dunner LLP

(57) ABSTRACT

A circuit for detecting electric current is provided. The circuit includes a MOSFET having a gate terminal, a source terminal, and a drain terminal, the drain terminal and the source terminal are connected in series in a loop through which an electric current flows. The circuit also includes a bias circuit, configured to generate a bias voltage at a gate terminal of the MOSFET to make the MOSFET operate in the linear region, and a voltage detection circuit, connected to the drain terminal and the source terminal of the MOSFET to detect a voltage difference between the drain terminal and the source terminal of the MOSFET, the voltage difference being used as a detection signal in the circuit for detecting the electric current.

15 Claims, 3 Drawing Sheets

U.S. PATENT DOCUMENTS

2002/0011874 A1 1/2002 Takahashi et al.
2005/0248360 A1 11/2005 Patel et al.

FOREIGN PATENT DOCUMENTS

| CN | 1037810 A | 12/1989 |
|---|---|---|
| CN | 1275203 A | 11/2000 |
| CN | 2881654 Y | 3/2007 |
| CN | 101029910 A | 9/2007 |
| EP | 0 340 918 | 7/1989 |
| JP | 2006105603 | 11/2008 |

OTHER PUBLICATIONS

Chinese Office Action dated Aug. 8, 2008, in related Chinese Application No. 200710073627.X, with English translation.
European Search Report for Application No. 07817170.9, dated Feb. 3, 2010, (7 pages).
Patent Cooperation Treaty, Written Opinion of the International Searching Authority for Application No. PCT/CN2007/070979, mailed Jan. 24, 2008 (6 pages).
Maxim, High-Side Current-Sense Measurement: Circuits and Principals, XP-002564897, Application Note 746, Nov. 19, 2001, (13 pages).

* cited by examiner

CIRCUIT AND APPARATUS FOR DETECTING ELECTRIC CURRENT

CROSS-REFERENCE TO RELATED APPLICATIONS

This application is a continuation of International Application No. PCT/CN2007/070979, filed on Oct. 29, 2007, which claims priority to Chinese Patent Application No. CN 200710073627.X filed on Mar. 22, 2007, titled "Circuit and Apparatus for Detecting Electric Current", the entire contents of these applications are incorporated herein by reference.

TECHNICAL FIELD

The present disclosure relates to detecting technology. More particularly, the present disclosure relates to a circuit and an apparatus for detecting electric current.

BACKGROUND

Detection in circuits is mainly to detect the electric current and the electric voltage in the circuit. Conventional electric voltage detecting technology has been very mature, wherein the detection could be carried out in any position of the circuit without obviously affecting the performance of the circuit. However, electric current detection is rather complex, and most of the electric current detection technologies achieve the detection objective by converting the electric current signal to electric voltage signal.

Conventional electric current detection employs a current detection resistor, which is connected in series in a circuit loop through which an electric current to be detected flows, and the electric current is determined by detecting an voltage between two ends of the current detection resistor. As show in FIG. 1, to detect an electric current $I_{dec}$ flowing through a load 2, a current detection resistor 1 is connected in series in a loop where the load 2 is located, wherein the electric current also flows through the load 2. Because the resistance of the detection resistor 1 is known already, after a voltage between two ends of the current detection resistor 1 is detected, the electric current $I_{dec}$ can be obtained according to Ohm's Law.

Voltage drop of the detection resistor 1 occurs while the detection resistor 1 is used to detect the electric current, and the voltage drop of the detection resistor 1 means a decrease in the available power supply. Taking the power supply into account, the voltage drop of the detection resistor 1 is required to be slight enough so that the power supply to other circuits will not be affected. Accordingly, the stronger the electric current $I_{dec}$ is, the smaller the value of the resistance of the detection resistor 1 is required to be. However, under the same process condition, the smaller the value of the resistance of the detection resistor 1 is, the more difficult the precision of the resistance of the resistor is to control and the more seriously the precision of the resistance of the resistor is affected by the discrete parameters. Furthermore, if the electric current $I_{dec}$ is strong to a certain extent, to satisfy the requirement of small voltage drop between the two ends of the detection resistor 1, the precision of the resistance of the detection resistor 1 is very low. The nominal resistance of the detection resistor 1 is used as the actual resistance to detect the electric current $I_{dec}$, which causes a serious detection error. Even the same circuits which are batch manufactured in accordance with the same process, the detection results from detecting the same circuit using the same nominal resistance of the detection resistor have big differences, and it is difficult to obtain the precise detection results required by the circuits.

Therefore, the electric current detection range is limited in the conventional electric current detection method in order to satisfy the requirement on the power supply in the circuit and the detection precision, and the conventional electric current detection method cannot be used to detect high electric current.

In addition, the detection resistor has a rated power limit: the detection resistor cannot work normally if the power of the detection resistor exceeds the rated power. The rated power limit also limits the application of the electric current detection while employing the detection resistor to detect the electric current.

SUMMARY

Accordingly, a circuit and an apparatus for detecting electric current with higher precision are provided in the embodiments of the present disclosure, so that the problem in the prior art, i.e., low precision as a result of the fact that the value of the resistance is affected by the discrete parameters when detecting high electric current.

A circuit for detecting electric current is provided and may include:

a MOSFET having a gate terminal, a source terminal, and a drain terminal, the source terminal and the a drain terminal being connected in series in a loop through which an electric current flows;

a bias circuit, configured to generate a bias voltage at a gate terminal of the MOSFET to make the MOSFET operate in the linear region;

a voltage detection circuit, connected to the source terminal and the drain terminal of the MOSFET to detect a voltage difference between the drain terminal and the source terminal of the MOSFET, the voltage difference being used as a detection signal in the circuit for detecting the electric current.

An apparatus for detecting electric current is also provided and includes an electric current detection circuit, wherein the electric current detection circuit includes:

a MOSFET having a gate terminal, a source terminal, and a drain terminal, the source terminal and the drain terminal being connected in series in a loop through which an electric current flows;

a bias circuit, configured to generate a bias voltage at a gate terminal of the MOSFET to make the MOSFET operate in the linear region;

a voltage detection circuit, connected to the source terminal and the drain terminal of the MOSFET to detect a voltage difference between the drain terminal and the source terminal of the MOSFET, the voltage difference being used as a detection signal in the circuit for detecting the electric current.

According to some embodiments, a MOSFET operating in the linear region is employed to detect the electric current. The voltage difference between the drain terminal and the source terminal of the MOSFET is very low even if the electric current is strong, thus the voltage difference has little effect on the power supply. Furthermore, the precision of the detection by using a MOSFET is higher than that by using a current detection resistor because the equivalent resistor of the MOSFET can be accurately determined.

DETAILED DESCRIPTION

A clear and full description is given below to the solutions according to embodiments of the present disclosure, with reference to the accompanying drawings.

In an embodiment, a method for detecting electric current is provided by using a Metal-Oxide-Semiconductor Field Effect Transistor (MOSFET), wherein the electric current flowing through the MOSFET is proportional to the voltage difference between the source terminal and drain terminal of the MOSFET when the MOSFET operates in the linear region.

Figure 1:
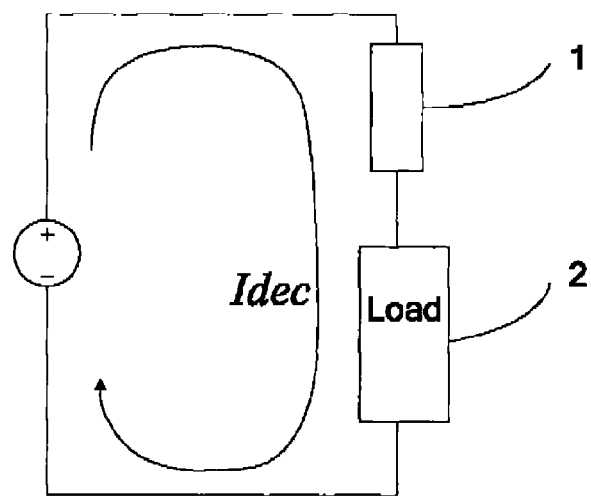
FIG. 1 illustrates a schematic circuit diagram of a conventional electric current detection circuit.
Figure 2:
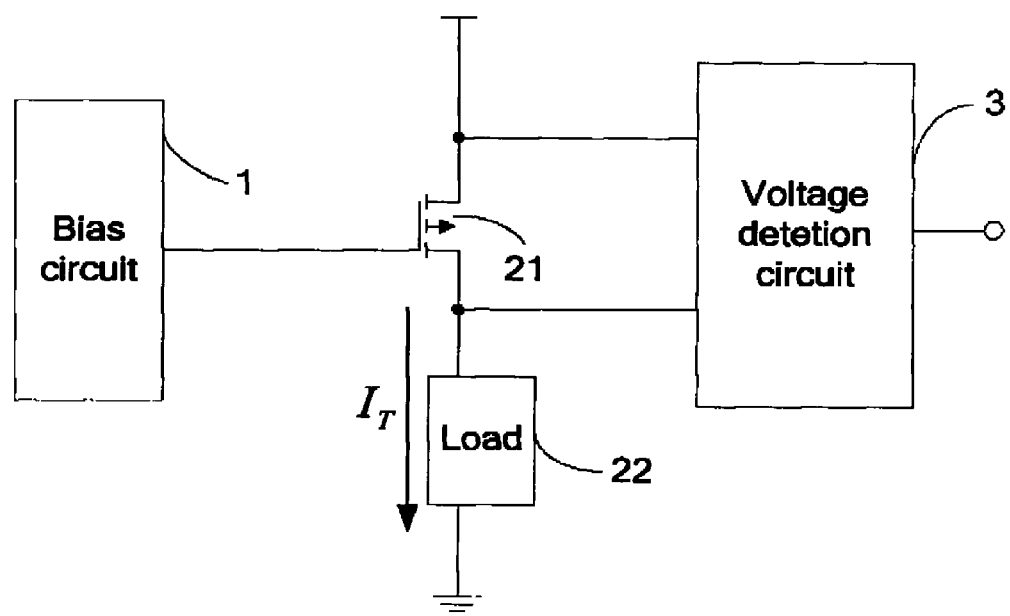
FIG. 2 illustrates an exemplary block diagram of a circuit for detecting electric current according to an embodiment of the present disclosure.

As shown in FIG. 2, a MOSFET 21 is connected in series to a load 22 through which an electric current $I_T$ flows. A bias circuit 1 is coupled to a gate terminal of the MOSFET 21 to provide a gate voltage to make the MOSFET 21 operate in the linear region. A voltage detection circuit 3 having two detection terminals is coupled to a drain terminal and a source terminal of the MOSFET 21 respectively to detect the voltage difference between the source terminal and drain terminal of the MOSFET 21. The amount of the electric current $I_T$ can be obtained by analyzing the proportional corresponding relation between the voltage difference between the source terminal and drain terminal of the MOSFET 21 and the electric current $I_T$.

For example, a characteristic formula of current-voltage in a P-channel MOSFET is:

$$I = K_P \frac{W}{L}[2(V_{SG} - V_{THP})V_{SD} - V_{SD}^2],$$

wherein $K_p$ is a process parameter, W/L is a ratio of width to length of the P-channel MOSFET, $V_{SG}$ is a voltage difference between the source terminal and gate terminal of the P-channel MOSFET, $V_{THP}$ is a threshold voltage of the P-channel MOSFET, and $V_{SD}$ is a voltage difference between the source terminal and drain terminal of the P-channel MOSFET, short for source-drain voltage difference.

The characteristic formula of current-voltage in a P-channel MOSFET can be transformed as follow:

$$I = K_P \frac{W}{L}[2(V_{SG} - V_{THP})V_{SD} - V_{SD}^2]$$
$$= K_P \frac{W}{L}[2(V_{SG} - V_{THP}) - V_{SD}] * V_{SD}$$

The transformed formula indicates that when $2(V_{SG} - V_{THP}) \gg V_{SD}$, in other words, when the P-channel MOSFET operates in the linear region, $$I = 2K_P \frac{W}{L}(V_{SG} - V_{THP}) * V_{SD}.$$

Therefore, the electric current I flowing through the P-channel MOSFET is proportional to the voltage difference between the source terminal and drain terminal of the P-channel MOSFET. The amount of the electric current I flowing through the P-channel MOSFET can be obtained if the voltage difference between the source terminal and drain terminal of the P-channel MOSFET is detected, that is, the voltage difference between the source terminal and drain terminal of the P-channel MOSFET may be used as the detection signal in the circuit for detecting electric current.

It can be seen from the formula $$I = 2K_P \frac{W}{L}(V_{SG} - V_{THP}) * V_{SD}$$

that when the P-channel MOSFET operates in the linear region, the P-channel MOSFET acts as an equivalent resistor $$R_E = \frac{1}{2K_P \frac{W}{L}(V_{SG} - V_{THP})}.$$

Further, when $2(V_{SG} - V_{THP}) \gg V_{SD}$, that is, when the P-channel MOSFET operates in the linear region, the $V_{SD}$ is very small even if the electric current I is large, and because $R_E = V_{SD}/I$, the $R_E$ is very small, so the requirement of dividing only a small voltage from the power while detecting large electric current is satisfied. Meanwhile, because of the process features of the P-channel MOSFET, the $K_p$, W/L, and $V_{THP}$ can be more accurately determined compared to a resistor, and the $V_{SG}$ can be accurately determined or detected. The precision of the equivalent resistor of the MOSFET when operates in is the linear region is higher than the detection resistor while the resistance of the equivalent resistor of the MOSFET when operating in is the linear region is the same as the resistance of the detection resistor. Therefore, the consistency of detection result of the method by using P-channel MOSFETs, which are manufactured under the same MOSFET process conditions, with the same ratio of width to length and threshold voltage, is higher than that of the method by using detection resistors, which are manufactured under the same resistor process conditions, while the two methods are used for detecting strong electric current in different circuits. That is, the precision of the electric current detection method by using a MOSFET is higher than that by using a conventional detection resistor.

Furthermore, the detection method by using the MOSFET can be applied to a large power circuit because the rated power of the MOSFET can be larger than the detection resistor.

Figure 3:
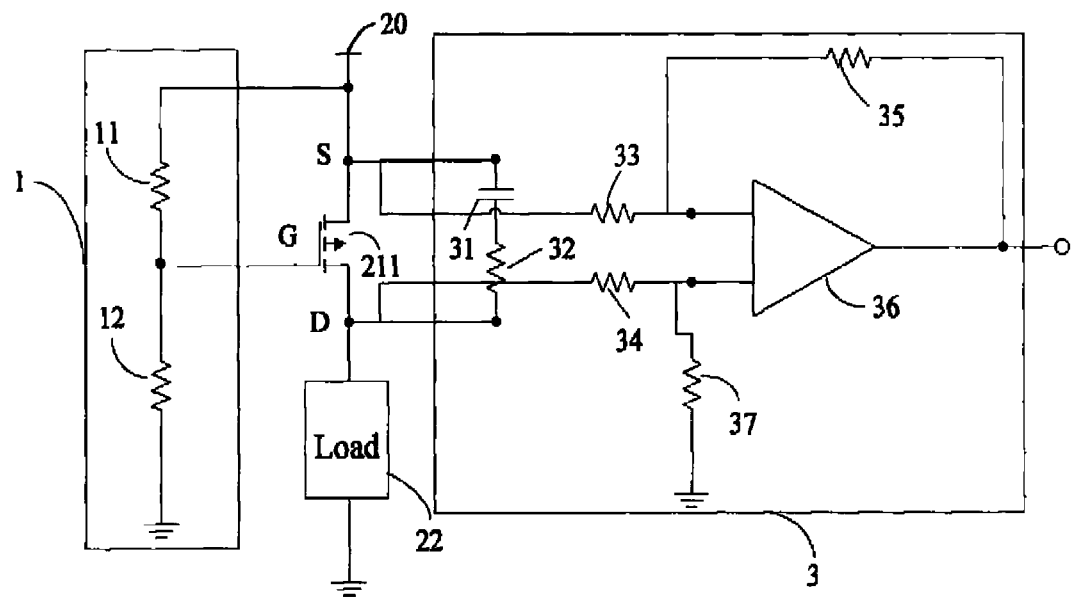
FIG. 3 illustrates an exemplary circuit schematic diagram of a circuit for detecting electric current according to a first embodiment of the present disclosure.

As shown in FIG. 3, the MOSFET 21 may be a P-channel MOSFET 211, the bias circuit 1 is a resistor voltage dividing circuit including a first bias resistor 11 and a second bias resistor 12, and the voltage detection circuit 3 may include a filtering module and a difference amplifier.

As also shown in FIG. 3, a first terminal of the first bias resistor 11 connects to a source terminal of the P-channel MOSFET 211, a second terminal of the first bias resistor 11, a gate terminal of the P-channel MOSFET 211 and a first terminal of the second bias resistor 12 connects to a same node, and a second terminal of the second bias resistor 12 connects to common circuit ground. The source terminal of the P-channel MOSFET 211 connects to a power supply 20, a drain terminal of the P-channel MOSFET 211 connects to a first terminal of a load 22, and a second terminal of the load 22 connects to common circuit ground.

The voltage detection circuit 3 includes a filtering module which include a filter resistor 32 and a filter capacitor 31, wherein a first terminal of the filter resistor 32 connects to the drain terminal of the P-channel MOSFET 211, a second terminal of the filter resistor 32 connects to a first terminal of the filter capacitor 31, and a second terminal of the filter capacitor 31 connects to the source terminal of the P-channel MOSFET 211.

The voltage detection circuit 3 also includes a difference amplifier which may be a voltage subtraction operating circuit. In particular, the voltage subtraction operating circuit may include an operational amplifier 36, a first resistor 33, a second resistor 34, a third resistor 35, and a fourth resistor 37. A first terminal of the first resistor 33 connects to the source terminal of the P-channel MOSFET 211, and a second terminal of the first resistor 33 connects to an inverting input of the operational amplifier 36 and a first terminal of the third resistor 35, a second terminal of the third resistor 35 connects to an output of the operational amplifier 36. A first terminal of the second resistor 34 connects to the drain of the P-channel MOSFET 211, a second terminal of the second resistor 34 connects to a non-inverting input of the operational amplifier 36 and a first terminal of the fourth resistor 37, and a second terminal of the fourth resistor 37 connects to common circuit ground.

Consistent with some embodiments, the formula $2(V_{SG}-V_{THP}) \gg V_{SD}$ will be satisfied as long as gate voltage $V_G$ of the P-channel MOSFET 211 is smaller than drain voltage $V_D$ of the P-channel MOSFET 211 to a certain degree.

Because the source-drain voltage difference $V_{SD}$ is very small when P-channel MOSFET 211 operates in the saturation region and the linear region, and the drain voltage $V_D$ of the P-channel MOSFET 211 is obtained by subtracting the source-drain voltage difference $V_{SD}$ from the power of the power supply $V_{20}$, that is, $V_D=V_{20}-V_{SD}$, the drain voltage $V_D$ is approximately equal to the power of the power supply $V_{20}$, so it is easy to make the gate voltage $V_G$ of the P-channel MOSFET 211 smaller than drain voltage $V_D$ of the P-channel MOSFET 211 to a certain degree.

Assume that the resistance of the first bias resistor 11 is $R_{11}$, resistance of the second bias resistor R12 is $R_{12}$, it can be seen that $$V_G = \frac{R_{12}}{R_{11}+R_{12}} * V_{20},$$

the $R_{11}$ and $R_{12}$ can be selected properly (for example, $R_{11} \gg R_{12}$), then the $V_G$ of the P-channel MOSFET 211 can be smaller than power of the power supply $V_{20}$ (also to the drain voltage $V_D$) to a certain degree to a certain degree which satisfies the formula $2(V_{SG}-V_{THP}) \gg V_{SD}$.

It should be noted that, the MOSFET connected in series between the power supply 20 and the load 22 is just one embodiment, in other embodiments, the MOSFET may be connected in series between two loads to detect the electric current if only the bias circuit can make sure that the MOSFET operates in the linear region.

From the foregoing analysis, the source-drain voltage difference $V_{SD}$, which is detected by the voltage detection circuit 3, can be used to indicate amount of the electric current detected when the MOSFET operates in the linear region.

The filter capacitor 31 and the filter resistor 32 can delay the startup of the P-channel MOSFET 211, and filter high frequency impulse current signal or interference signal to eliminate the effect caused by the signals. The filter capacitor 31 and the filter resistor 32 can be cancelled; the source-drain voltage difference can be detected just by the latter voltage subtraction operating circuit without the filter module.

Assuming that the resistance of the first resistor 33 is $R_{33}$, resistance of the second resistor R34 is $R_{34}$, the resistance of the third resistor R35 is $R_{35}$, resistance of the fourth resistor R37 is $R_{37}$, then the voltage of the output of the operational amplifier 36 $V_T$ is:

$$V_T = \frac{R_{33}+R_{35}}{R_{33}} * \frac{R_{37}}{R_{34}+R_{37}} * V_D - \frac{R_{35}}{R_{33}} * V_S.$$

In the formula, if resistances of the resistors satisfy the relation:

$$\frac{R_{35}}{R_{33}} = \frac{R_{37}}{R_{34}},$$

then the following formula can be obtained:

$$V_T = \frac{R_{35}}{R_{33}} * (V_D - V_S)$$
$$= -\frac{R_{35}}{R_{33}} * V_{SD}$$

From the foregoing formula, the voltage subtraction operating circuit detects the source-drain voltage difference of the P-channel MOSFET 211, and from the foregoing analysis, the source-drain voltage difference of the P-channel MOSFET 211 indicates the electric current to be detected, so the circuit provided in the exemplary embodiment can detect the electric current.

In this embodiment, the voltage detection circuit 3 actually employs a difference amplifier to detect the voltage, the fourth resistor R37 can be designed as an adjustable resistor to reduce the effect to the precision of the detection caused by input error of the difference amplifier.

It should be noted that, the connection manner of the voltage subtraction operating circuit is not limited to subtracting the source voltage from the drain voltage to obtain the source-drain voltage difference, there are also other types of connections that could obtain the source-drain voltage difference, for example, by subtracting the drain voltage from the source voltage to obtain the source-drain voltage difference, which may be known by those skilled in the art.

According the foregoing description, the filter capacitor 31 and the filter resistor 32 can be cancelled. If employed, the connection manner of the capacitor 31 and the filter resistor 3 is not limited to the embodiment illustrated in FIG. 3. In another embodiment, only a filter capacitor 31 is employed, and the two terminals of the filter capacitor 31 are connected to a source terminal and a drain terminal of the P-channel MOSFET 211 respectively. In another embodiment, one terminal of the capacitor 31 connects to a source terminal of the P-channel MOSFET 211, and the other terminal of the capacitor 31 connects to one terminal of the filter resistor 32, the other terminal of the filter resistor 32 connects to a source terminal of the P-channel MOSFET 211.

Figure 4:
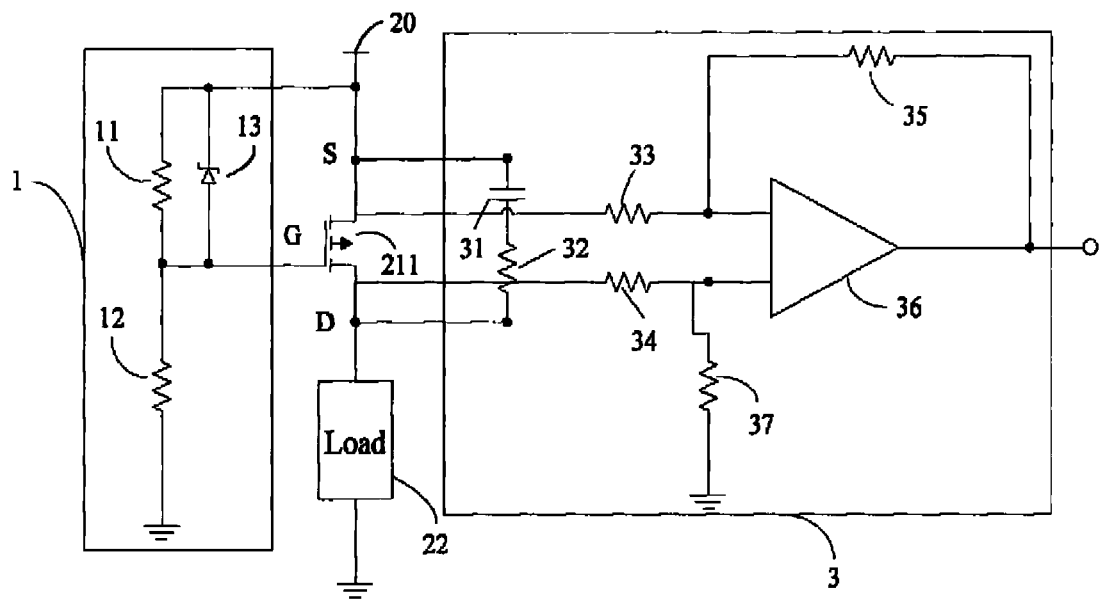
FIG. 4 illustrates an exemplary circuit schematic diagram of a circuit for detecting electric current according to a second embodiment of the present disclosure.

As shown in FIG. 4, a zener diode 13 is connected between a source terminal and a drain terminal of the P-channel MOSFET 211 compared to the embodiment in FIG. 3 to make the source-gate voltage difference $V_{SG}$ more stable. An anode of the zener diode 13 connects to a gate terminal of the P-channel MOSFET 211, a cathode of the zener diode 13 connects to the source terminal of the P-channel MOSFET 211, then the voltage between the anode and cathode of the zener diode 13 is the source-gate voltage difference $V_{SG}$.

The zener diode 13 provides a temperature compensation function to the detection circuit. Because threshold voltage $V_{THP}$ of the P-channel MOSFET 211 has a negative temperature coefficient, while detecting the electric current by the formula $$I = 2K_P \frac{W}{L}(V_{SG} - V_{THP}) * V_{SD},$$

the detection value may be affected because the $V_{THP}$ varies with the temperature variation. The zener diode 13 has a negative temperature coefficient when operating in a zener effect-dominant, so the voltage difference $V_{SG}$-$V_{THP}$ would not vary with the temperature variation by adopting a proper temperature coefficient, thus decrees or eliminate the temperature impact to the precision of the detection.

The zener diode 13 has a positive temperature coefficient when the source-gate voltage difference $V_{SG}$ is very large and the zener diode 13 operates in an avalanche effect-dominant, employing the zener diode 13 may not decrease or eliminate the temperature impact to the precision of the detection.

Figure 5:
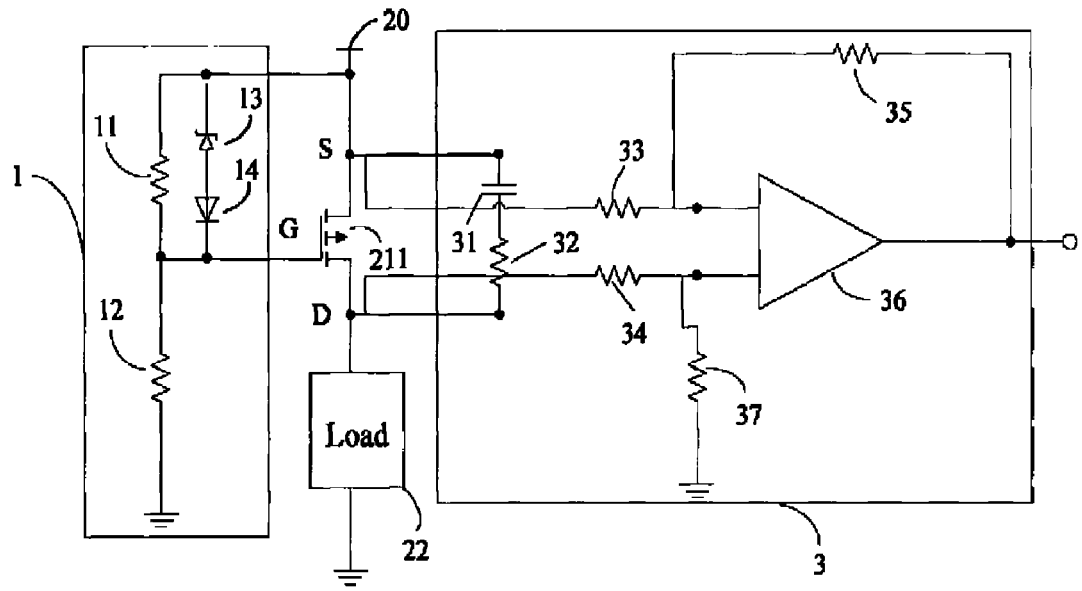
FIG. 5 illustrates an exemplary circuit schematic diagram of a circuit for detecting electric current according to a third embodiment of the present disclosure.

As shown in FIG. 5, in order to decrease or eliminate the temperature impact to the precision of the detection when the zener diode 13 has a positive temperature coefficient, a diode 14 with positive temperature coefficient connects between the zener diode 13 and a gate terminal of the P-channel MOSFET 211. That is, a cathode of the zener diode 13 connects to a source terminal of the P-channel MOSFET 211, an anode of the zener diode 13 connects to a cathode of the diode 14, and a cathode of the diode 14 connects to the gate terminal of the P-channel MOSFET 211. In this case, $V_{SG}$-$V_{THP}$=$V_{13}$+$V_{14}$-$V_{THP}$, wherein the $V_{13}$ is the voltage between the two terminals of the zener diode 13, $V_{14}$ is the voltage between the two terminals of the diode 14. $V_{13}$-$V_{THP}$ has a positive temperature coefficient because $V_{13}$ has a positive temperature coefficient while $V_{THP}$ has a negative temperature coefficient. For the $V_{14}$ has a negative temperature coefficient, the $V_{13}$+$V_{14}$-$V_{THP}$ may have a zero temperature coefficient, which means not varying with the temperature variation, when a proper diode 14 and zener diode 13 are selected. More diodes may be connected in series to make the $V_{13}$+$V_{14}$-$V_{THP}$ not vary with the temperature variation if one diode is not enough, which could improve the precision.

It could be understood that the first bias resistor 11 and the second bias resistor 12 connected in series to generate the bias voltage is just an exemplary embodiment of the present, other biasing schemes could be used which could be apparent to those skilled in the art, for example, the first bias resistor 11 and the second bias resistor 12 can be replaced by a MOSFET connected in diode manner, which also can generate a bias voltage required in this embodiment to make the P-channel MOSFET 211 operate in the linear region. Other schemes can be adopted if only the P-channel MOSFET 211 operates in the linear region.

Figure 6:
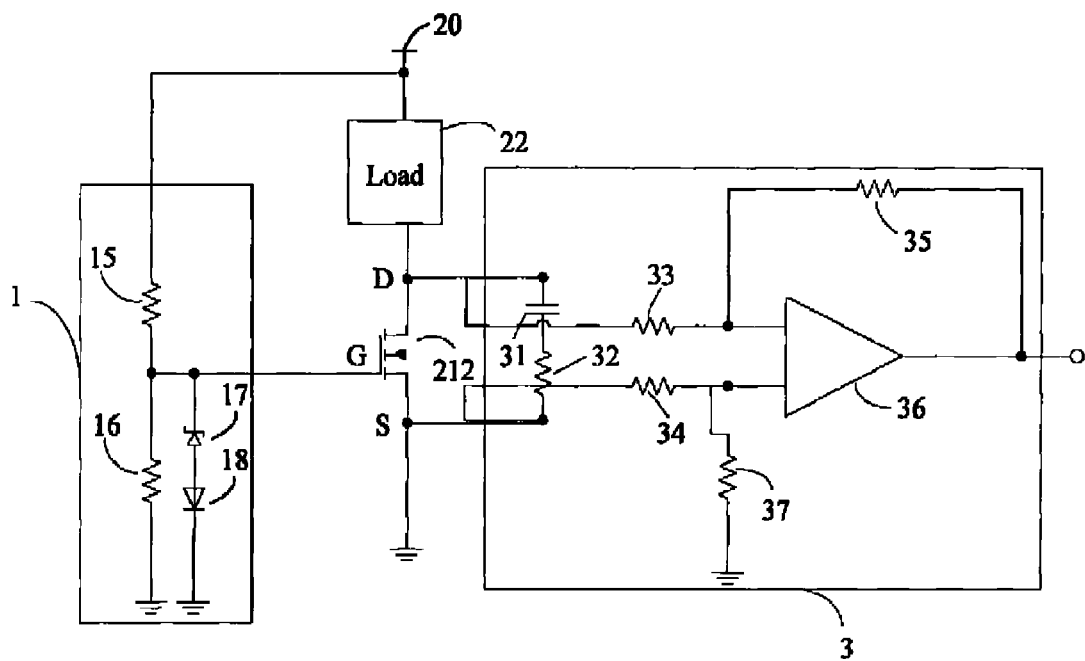
FIG. 6 illustrates an exemplary circuit schematic diagram of a circuit for detecting electric current according to a fourth embodiment of the present disclosure.

According to some embodiments, the MOSFET 21 in FIG. 2 may employ an N-channel MOSFET 212, as shown in FIG. 6. Compared to the foregoing embodiments, the voltage detection circuit does not change and the drain-source voltage VDS is detected. The difference is that the connection manner of the load 22, the N-channel MOSFET 212 and the bias circuit 1 are changed. A first terminal of the load 22 connects to the power supply 20, a second terminal of the load 22 connects to a drain terminal of the N-channel MOSFET 212, and a source terminal of the N-channel MOSFET 212 connects to common circuit ground. The bias circuit 1 includes a third bias resistor 15, a fourth bias resistor 16, a zener diode 17, and a diode 18. A first terminal of the third bias resistor 15 connects to the power supply 20, and a second terminal of the third bias resistor 15 connects to a gate terminal of the N-channel MOSFET 212, a cathode of the zener diode 17, and a first terminal of the fourth bias resistor 16, and a second terminal of the fourth bias resistor 16 connects to common circuit ground. An anode of the zener diode 17 connects to an anode of the diode 18, and a cathode of the diode 18 connects to common circuit ground.

Similar to P-channel MOSFET, N-channel MOSFET operates in the linear region under the condition $2(V_{GS}-V_{THN})$ $>>V_{DS}$, wherein the $V_{GS}$ is the voltage difference between the gate terminal and the source terminal of the MOSFET, short for gate-source voltage difference, and the VDS is the voltage difference between the drain terminal and the source terminal of the MOSFET. An electric current flowing through the MOSFET when the MOSFET operates in the linear region is:

$$I = 2K_N \frac{W}{L}(V_{GS} - V_{THN}) * V_{DS},$$

wherein $K_N$ is a process parameter, and W/L is a ratio of width to length of the MOSFET.

Similar to a P-channel MOSFET, the N-channel MOSFET acts as an equivalent resistor when operates in the linear region. The resistance of the equivalent resistor is very low, and the precision of the equivalent resistor is higher than the current detection resistor because of process features, so the precision of the detection by using an N-channel MOSFET is higher than that by using a current detection resistor. All the principles have been described in the foregoing analysis, and thus are not repeater any longer again.

For the N-channel MOSFET 212, if the gate voltage $V_G$ of the N-channel MOSFET 212 is larger than the drain voltage of the N-channel MOSFET 212 to a certain degree, the bias circuit 1 could make the voltage of all the terminals of the N-channel MOSFET 212 satisfy the relation $2(V_{GS}-V_{THN})$ $>>V_{DS}$.

Because the drain-source voltage difference $V_{DS}$ is very small when the N-channel MOSFET 212 operates in the linear region and in the saturation region, and the drain voltage $V_D$ equals to the $V_{DS}$, that is, $V_D$=$V_{DS}$, from this relation, it can be seen that the $V_D$ is approximately equal to the ground voltage, so it is easy to make $V_G$ to be larger than $V_D$ to a certain degree. Assuming that the resistance of the third bias resistor 15 is $R_{15}$, and the resistance of the fourth bias resistor 16 is $R_{16}$, then $$V_G = \frac{R_{16}}{R_{15} + R_{16}} * V_{20}.$$

The value for $R_{15}$ and $R_{16}$ can be selected properly (for example, $R_{16} \gg R_{15}$), then the $V_G$ of the N-channel MOSFET 212 can be larger than drain voltage $V_D$ to a certain degree to a certain degree which satisfies the formula $2(V_{GS}-V_{THN}) \gg V_{DS}$.

The gate voltage of the N-channel MOSFET 212 can be more stable when the zener diode 17 is employed. Meanwhile, the zener diode 17 has a negative temperature coefficient when operating in a zener effect-dominant, which could compensate for the negative temperature coefficient of the threshold voltage $V_{THN}$ of the N-channel MOSFET 212 to decrease the detection error because of the temperature effect. There is a negative temperature coefficient between the cathode and anode of the zener diode 17 when the gate-source voltage difference of the N-channel MOSFET 212 is large and the zener diode 17 operates in avalanche breakdown-dominate. At this time, a diode 18 with negative temperature coefficient can be connected in series to compensate, and more diodes with negative temperature coefficients can be employed as described in the foregoing embodiments using P-channel MOSFET for electric current detection.

In another embodiment, the zener diode 17 and the diode 18 can be cancelled when a higher precision electric current detection is processed by using a current detection resistor.

In another embodiment, other connection manners of the bias circuit 1 can be adopted if only the N-channel MOSFET 212 operates in the linear region, and the voltage detection circuit 1 is can be other connection manners if only the drain-source voltage difference of the N-channel MOSFET 212 can be detected.

In embodiments of the present disclosure, an apparatus for detecting electric current is provided. The apparatus include the circuit for detecting electric current in the foregoing embodiments. In some embodiments, the apparatus further includes a display module, the display module is configured to convert the voltage difference between the MOSFET detected by the voltage detection circuit to an electric current value, and display the electric current value.

Embodiments described above are only exemplary embodiments of the present disclosure, and are not intended to limit the protection scope of the present disclosure. Modifications, alternations, and improvements without departing from the spirit and scope of the present disclosure all fall in the scope of the present disclosure as defined in the claims and their equivalents.

What is claimed is:

1. A circuit for detecting electric current, comprising:
    a MOSFET having a gate terminal, a source terminal, and a drain terminal, the source terminal and the drain terminal being connected in series in a loop through which an electric current flows;
    a bias circuit, configured to generate a bias voltage at a gate terminal of the MOSFET to make the MOSFET to operate in the linear region, wherein the bias circuit comprises a first bias resistor connected between a voltage source terminal of a power supply and the gate terminal of the MOSFET, and a second bias resistor connected between the gate terminal of the MOSFET and a common circuit ground, the first bias resistor and the second bias resistor generating the bias voltage at the gate terminal of the MOSFET from the voltage source terminal of the power supply and the common circuit ground to make the MOSFET to operate in the linear region;
    a voltage detection circuit, connected to the source terminal and the drain terminal of the MOSFET to detect a voltage difference between the drain terminal and the source terminal of the MOSFET, the voltage difference being used as a detection signal in the circuit for detecting the electric current.

2. The circuit for detecting electric current of claim 1, wherein the source terminal of the MOSFET connects to a common potential terminal of the loop which the electric current flowing through, and the drain terminal of the MOSFET connects to a load which is located in the loop.

3. The circuit for detecting electric current of claim 2, wherein the MOSFET is a P-channel MOSFET, and the common potential terminal is the voltage source terminal of the power supply.

4. The circuit for detecting electric current of claim 3, wherein the bias circuit further comprises:
    a zener diode, wherein a cathode of the zener diode is connected to the voltage source terminal of the power supply, and an anode of the zener diode is connected to the gate terminal of the P-channel MOSFET.

5. The circuit for detecting electric current of claim 4, wherein a temperature coefficient of a voltage between the cathode and the anode of the zener diode is the same as a temperature coefficient of a threshold voltage of the P-channel MOSFET.

6. The circuit for detecting electric current of claim 2, wherein the MOSFET is an N-channel MOSFET, and the common potential terminal is a common circuit ground.

7. The circuit for detecting electric current of claim 6, wherein the bias circuit further comprises:
    a zener diode, wherein a cathode of the zener diode connected to the gate terminal of the N-channel MOSFET, and an anode of the zener diode connected to the common circuit ground.

8. The circuit for detecting electric current of claim 7, wherein a temperature coefficient of a voltage between the cathode and anode of the zener diode is the same as a temperature coefficient of a threshold voltage of the N-channel MOSFET.

9. The circuit for detecting electric current of claim 1, wherein the voltage detection circuit comprises an difference amplifier having two inputs coupled to the source terminal and the drain terminal of the MOSFET respectively to receive the voltage difference between the source terminal and the drain terminal of the MOSFET, the difference amplifier being configured to amplify the voltage difference and output the amplified voltage difference.

10. The circuit for detecting electric current of claim 9, wherein the difference amplifier comprises:
    an output;
    a first input, connected to the source terminal or the drain terminal of the MOSFET;
    a second input, connected to the drain terminal or the source terminal of the MOSFET;
    an operational amplifier having an output connected to the output of the difference amplifier;
    a first resistor, connected between the first input and an inverting input of the operational amplifier;
    a second resistor, connected between the second input and a non-inverting input of the operational amplifier;
    a third resistor, connected between the inverting input of the operational amplifier and the output of the difference amplifier; and a fourth resistor, connected between the non-inverting input of the operational amplifier and the common circuit ground.

11. The circuit for detecting electric current of claim 9, wherein the voltage detection circuit further comprises a filter resistor and a filter capacitor connected in series between the drain terminal and the source terminal of the MOSFET.

12. An apparatus for detecting electric current, comprising the circuit for detecting electric current of claim 1; and a display module.

13. The apparatus for detecting electric current of claim 12, wherein the display module configured to convert the voltage difference between the MOSFET detected by the voltage detection circuit to an electric current value, and display the electric current value.

14. The circuit for detecting electric current of claim 1, wherein the MOSFET is a P-channel MOSFET, and the first bias resistor and the second bias resistor generating the bias voltage at the gate terminal of the P-channel MOSFET from the voltage source terminal of the power supply and the common circuit ground to make the P-channel MOSFET to satisfy the relation $2(V_{SG}-V_{THP}) \gg V_S$, wherein $V_{SG}$ is a voltage difference between the source terminal and the gate terminal of the P-channel MOSFET, $V_{THP}$ is a threshold voltage of the P-channel MOSFET, and $V_{SD}$ is a voltage difference between the source terminal and the drain terminal of the P-channel MOSFET.

15. The circuit for detecting electric current of claim 14, wherein the resistance of the first bias resistor is larger than the resistance of the second bias resistor, and the first bias resistor and the second bias resistor generate the bias voltage at the gate terminal of the P-channel MOSFET, which makes the P-channel MOSFET to satisfy the relation $2(V_{SG}-V_{THP}) \gg V_{SD}$.

* * * * *